United States Patent
Banba et al.

(10) Patent No.: US 8,936,679 B2
(45) Date of Patent: Jan. 20, 2015

(54) SINGLE CRYSTAL PULLING-UP APPARATUS OF PULLING-UP SILICON SINGLE CRYSTAL AND SINGLE CRYSTAL PULLING-UP METHOD OF PULLING-UP SILICON SINGLE CRYSTAL

(75) Inventors: Hironori Banba, Niigata (JP); Hiromichi Isogai, Niigata (JP); Yoshiaki Abe, Niigata (JP); Takashi Ishikawa, Niigata (JP); Shingo Narimatsu, Niigata (JP); Jun Nakao, Niigata (JP); Hiroyuki Abiko, Niigata (JP); Michihiro Ohwa, Niigata (JP)

(73) Assignee: Globalwafers Japan Co., Ltd, Niigata (JP)

( * ) Notice: Subject to any disclaimer, the term of this patent is extended or adjusted under 35 U.S.C. 154(b) by 612 days.

(21) Appl. No.: 13/137,812

(22) Filed: Sep. 14, 2011

(65) Prior Publication Data
US 2012/0067272 A1 Mar. 22, 2012

(30) Foreign Application Priority Data
Sep. 16, 2010 (JP) .............................. P2010-207558

(51) Int. Cl.
*C30B 15/22* (2006.01)
*C30B 15/30* (2006.01)
*C30B 29/06* (2006.01)

(52) U.S. Cl.
CPC ................ *C30B 15/22* (2013.01); *C30B 15/30* (2013.01); *C30B 29/06* (2013.01)
USPC ................... 117/15; 117/11; 117/13; 117/14; 117/30; 117/35; 117/200; 117/206; 117/208; 117/218

(58) Field of Classification Search
CPC ........ C30B 15/00; C30B 15/20; C30B 15/22; C30B 15/26; C30B 15/30
USPC ........... 117/11, 13–15, 30, 35, 200, 206, 208, 117/218, 928, 931–932
See application file for complete search history.

(56) References Cited

U.S. PATENT DOCUMENTS

2009/0038537 A1* 2/2009 Minami .......................... 117/13

FOREIGN PATENT DOCUMENTS

| JP | 2008-189524 A | | 8/2008 |
| JP | 2008189524 A | * | 8/2008 |

\* cited by examiner

*Primary Examiner* — Kenneth A Bratland, Jr.
(74) *Attorney, Agent, or Firm* — McGinn IP Law Group, PLLC

(57) ABSTRACT

According to one exemplary embodiment, a single crystal pulling-up apparatus of pulling-up silicon single crystals by a Czochralski method, is provided with: a neck diameter measuring portion which measures a diameter of a grown neck portion; a first compensation portion which outputs a first compensated pulling-up speed for the seed crystals based on a difference between a measured value of the diameter of the neck portion and a target value of the neck portion diameter previously stored; a second compensation portion which outputs a second pulling-up speed while limiting an upper limit of the first pulling-up speed to a first limit value; and a crucible rotation number compensation portion which lowers the number of a rotation of a crucible at least in a period where the upper limit of the first pulling-up speed is limited to the first limit value.

20 Claims, 13 Drawing Sheets

Dia-Tag — 0 (mm)

Dia — 0 (mm)

SL1 — SL-high1
— 0 (mm/min)

SL — 0 (mm/min)

SL-Tag — 0 (mm/min)

CR — CR0
— 0 (rpm)

→ TIME

FIG. 10                    PRIOR ART
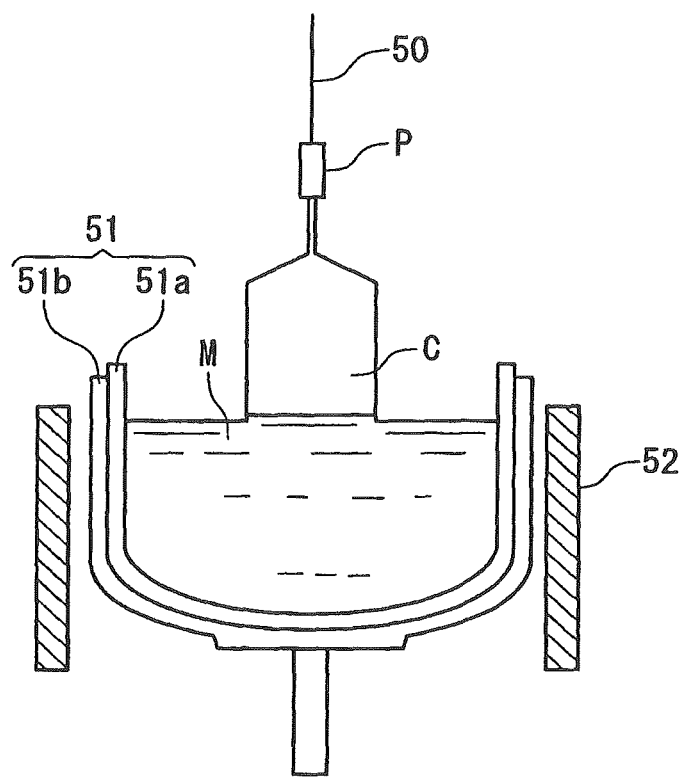

SINGLE CRYSTAL PULLING-UP APPARATUS OF PULLING-UP SILICON SINGLE CRYSTAL AND SINGLE CRYSTAL PULLING-UP METHOD OF PULLING-UP SILICON SINGLE CRYSTAL

CROSS REFERENCE TO RELATED APPLICATION(S)

The application is based upon and claims the benefit of priority from Japanese Patent Application No. 2010-207558 filed on Sep. 16, 2010; the entire content of which are incorporated herein by reference.

TECHNICAL FIELD

The present invention relates to a single crystal pulling-up apparatus and a single crystal pulling-up method of pulling-up single crystals while growing them by a Czochralski method (hereinafter referred to as a "CZ method").

BACKGROUND

For growing silicon single crystals, a CZ method has been used generally. The method includes bringing seed crystals into contact with the surface of a molten liquid of silicon contained in a crucible, rotating the crucible, and pulling-up the seed crystals upward while rotating the seed crystals in a direction opposite to a rotating direction of the crucible, thereby forming single crystals at a lower end of the seed crystals.

As shown in FIG. 10, in a related-art pulling-up method using the CZ method, a polysilicon is charged in a crucible 51 having a double structure of a quartz glass crucible 51a and a graphite crucible 51b, and the polysilicon is heated by a heater 52 to form a molten silicon liquid M. Then, seed crystals P attached to a pulling-up wire 50 are brought into contact with the molten silicon liquid M and silicon single crystals C are pulled-up.

Generally, before starting the pulling-up, necking of bringing the seed crystals P into contact with the molten silicon liquid M to melt a top end of the seed crystals P is performed after the temperature of the molten silicon liquid M is settled. The necking is an indispensable step for removing dislocation caused in silicon single crystals due to thermal shock generated upon contact between the seed crystals P and the molten silicon liquid M. By the necking, a neck portion P1 is formed as shown in FIG. 11.

For eliminating dislocation in the single crystals C formed below the neck portion P1, it is usually necessary that the neck portion P1 has a minimum diameter of 3 to 4 mm and a length of about 15 mm.

Further, as steps after starting the pulling-up, the following steps: a step for forming a crown portion of enlarging the diameter of crystals to a diameter of a straight trunk after the end of the necking; a step for forming the straight trunk of growing a constant diameter portion C2 after forming a shoulder C1; and a step for forming a tail portion of gradually decreasing the diameter of single crystals after the straight trunk forming step are performed.

The diameter of single crystals to be grown has been enlarged and the weight of single crystals to be pulled up has been increased in recent years. Accordingly, it is one of major subjects to prevent fracture of the neck portion P1 during pulling-up.

For the subject described above, Japanese Patent Application Publication No. JP-A-2008-189524 discloses a method of forming an enlarged diameter portion P1a and a reduced diameter portion P1b alternately to form a protuberant portion P1 so as to improve the strength of the neck portion P1 as shown in FIG. 12. According to the method, the strength of the neck portion P1 can be improved and the possibility of fracture can be decreased greatly than in a case of merely forming a narrow neck portion P1.

While the protuberant neck portion P1 described above has been formed so far by controlling the pulling-up speed of the seed crystals P and the temperature of the molten silicon liquid M, since the response characteristic of the temperature change for the molten silicon liquid M is poor, this is mainly depend on the control for the pulling-up speed of the seed crystals P.

Specifically, it is controlled by increasing the pulling-up speed of the seed crystal P in a case of intending to narrow the neck portion P1 and lowering the pulling-up speed of the seed crystal P in a case of intending to enlarge the neck portion P1.

It has been known that when the pulling-up speed of the seed crystals P is lower than a predetermined speed (for example, 2.5 mm/min or lower), a boundary M1 between the lower end of the neck portion P1 and the molten silicon liquid M has a concave shape as shown in FIG. 13A, whereas the boundary M1 has a convex shape when the pulling-up speed is increased to higher than the predetermined speed as shown in FIG. 13B.

However, when the pulling-up speed is increased in order to form a reduced diameter portion P1b by narrowing the neck portion P1, there is a subject that the boundary M1 has a convex shape as shown in FIG. 13B and dislocation tends to be caused when the boundary M1 has a convex shape.

In view of the subject described above, the applicant of the present invention has found that a narrow neck portion P1 (reduced diameter portion P1b) can be formed by lowering the number of rotation of a crucible even when the upper limit of the pulling-up speed of the seed crystals P is limited such that the boundary M1 has no convex shape.

For this purpose, control of limiting the pulling-up speed of the seed crystal P and lowering the number of rotation of the crucible when the upper limit is limited may be performed manually, but this results in a subject of requiring skilled workers, increasing the cost, and making the quality instable.

SUMMARY OF THE INVENTION

The present invention to provide a single crystal pulling-up apparatus of pulling-up silicon single crystals from a crucible by a Czochralski method capable of pulling-up single crystals at a stable quality by forming an enlarged diameter portion and a reduced diameter portion alternately to a neck portion, and capable of preventing dislocation from seed crystals to a straight trunk portion, as well as a single crystal pulling-up method.

According to one aspect of the invention, a single crystal pulling-up apparatus of pulling-up silicon single crystals by a Czochralski method by bringing seed crystals into contact with a molten silicon liquid in a crucible and by growing a neck portion where an enlarged diameter portion and a reduced diameter portion are formed alternately, the apparatus is provided with: a neck diameter measuring portion which measures a diameter of a grown neck portion; a first compensation portion which outputs a first compensated pulling-up speed for the seed crystals based on a difference between a measured value of the diameter of the neck portion obtained from the neck diameter measuring portion and a target value of the neck portion diameter previously stored in a storage portion; a second compensation portion which outputs a second pulling-up speed while limiting an upper limit of the first pulling-up speed to a first limit value; and a crucible rotation number compensation portion which lowers the number of the rotation of the crucible at least in a period where the upper limit of the first pulling-up speed is limited to the first limit value.

Other aspects and advantages of the invention will be apparent from the following description, the drawings and the claims.

BRIEF DESCRIPTION OF THE DRAWINGS

FIG. 10 is a block diagram showing an outlined configuration of a related-art single crystal pulling-up apparatus.

DETAILED DESCRIPTION OF THE EXEMPLARY EMBODIMENTS

Figure 1:
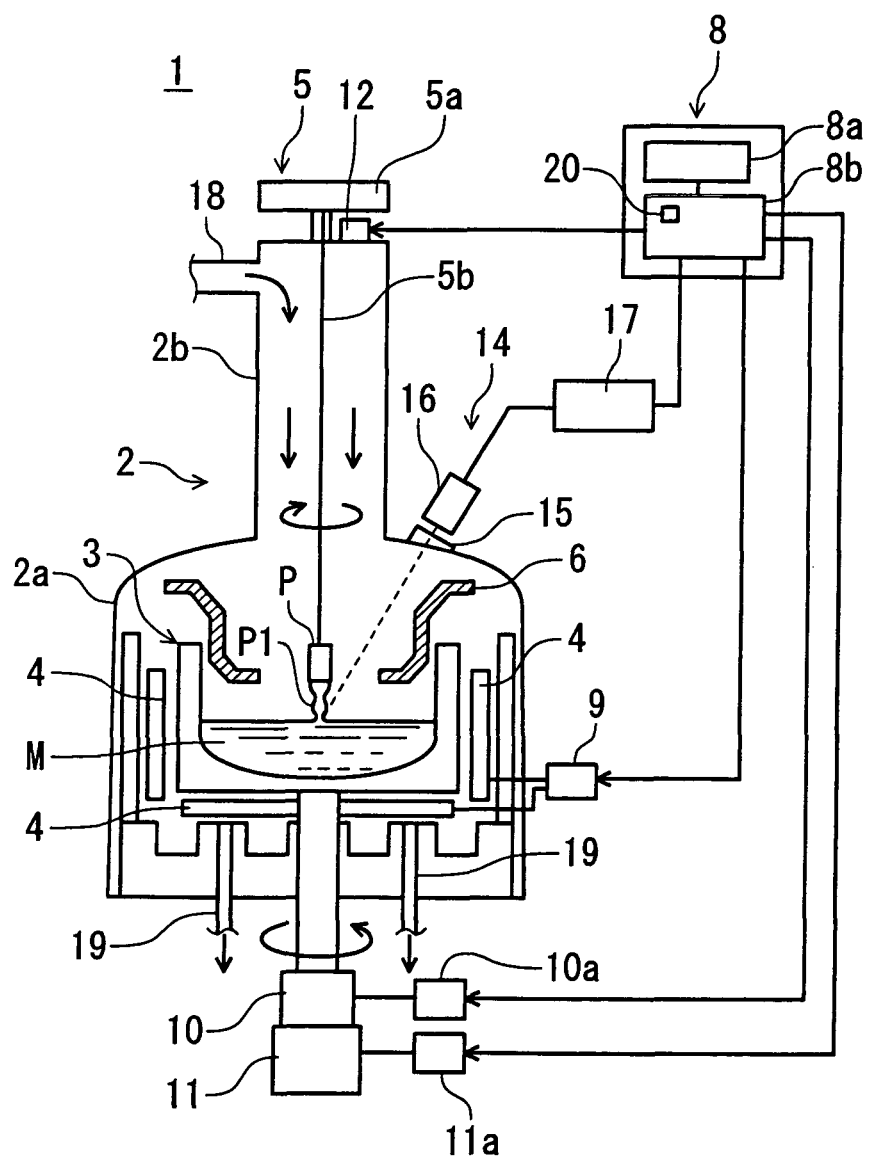
FIG. 1 is a block diagram showing an entire configuration of a single crystal pulling-up apparatus according to the invention.

A first embodiment of a single crystal pulling-up apparatus and a single crystal pulling-up method according to the invention is to be described with reference to the drawings. FIG. 1 is a block diagram showing an entire configuration of a single crystal pulling-up apparatus 1 according to the invention.

The single crystal pulling-up apparatus 1 includes a furnace body 2 formed by putting a pull chamber 2b on a top of a cylindrical main chamber 2a, a crucible 3 disposed in the furnace body 2, a heater 4 for melting a semiconductor material (polysilicon) M charged in the crucible 3, and a pulling-up mechanism 5 for pulling-up single crystals C to be grown. The crucible 3 has a double walled structure in which an inner side comprises a quartz glass crucible and an outer side comprises a graphite crucible.

Further, the pulling-up mechanism 5 has a winding mechanism 5a driven by a motor and a hoisting wire 5b wound up by the winding mechanism 5a, and seed crystals P are attached to the top end of the wire 5b.

Further, a gas introduction port 18 is disposed in an upper portion of the pull chamber 2b for introducing a predetermined gas (for example, Ar gas) into the furnace body 2, and gas exhaust ports 19 are disposed at a bottom of the main chamber 2b for exhausting the gas introduced into the furnace body 2. Accordingly, a gas flow at a predetermined flow rate from upward to downward is formed in the furnace body 2.

Further, in the main chamber 2a, a radiation shield 6 is disposed above and near the crucible 3 for rectifying a gas flow in the furnace body 2. The radiation shield 6 is opened at an upper portion and a lower portion thereof for surrounding the periphery of the single crystals C and shields excessive radiation heat from the heater 4, etc. applied to the single crystals C during growing. The size of the distance (gap) between the lower end of the radiation shield 6 and the surface of the molten liquid is controlled so as to maintain a predetermined distance in accordance with desired characteristics of single crystals to be grown.

Further, a neck diameter detector 14 (a neck diameter detection portion) is disposed to the outside of the furnace body 2 for detecting the diametrical size of the neck portion P1 grown in the vicinity of the liquid surface M1 of the molten silicon liquid M.

The neck diameter detector 14 includes a camera port 15 comprising a light permeable heat resistant glass disposed in the upper portion of the main chamber 2b, a CCD camera 16 for capturing an image of a predetermined region above a molten surface via the camera port 15, and an image processor 17 for calculating the signals of the image captured by the CCD camera 16.

The optical axis of the CCD cameral 16 is directed via the camera port 15 to a predetermined spot on the molten liquid surface, the CCD camera 16 is configured to capture the image at the predetermined spot and output the captured image to the image processor 17.

Further, the image processor 17 is configured to process image signals input from the CCD camera 16, detect the size of the neck diameter of the crystals pulled up from the liquid surface of the molten silicon liquid, and output the same to an arithmetic controller 8b of a computer 8.

Further, as shown in FIG. 1, the single crystal pulling-up apparatus 1 includes a heater control section 9 for controlling the amount of power supplied to the heater 4 that controls the temperature of the molten silicon liquid M, a motor 10 for rotating the crucible 3, and a motor control section 10a for controlling the number of rotation of the motor 10. Further, the single crystal pulling-up apparatus 1 includes an lifting device 11 for controlling the height of the crucible 3, a lifting device control section 11a for controlling the lifting device 11, and a wire reel rotation device control section 12 for controlling the pulling-up speed and the number of rotation of grown crystals. Each of the control section 9, 10a, 11a, and 12 is connected to the arithmetic controller 8b of the computer 8.

Further, a storage device 8a (a storage portion) of the computer 8 stores a single crystal growing program for executing each of the steps of single crystal growing, and a neck portion forming control circuit is disposed to the arithmetic controller 8b for controlling the values of the pulling-up speed of the seed crystals P and the number of rotation of the crucible during formation of the neck portion.

Figure 2:
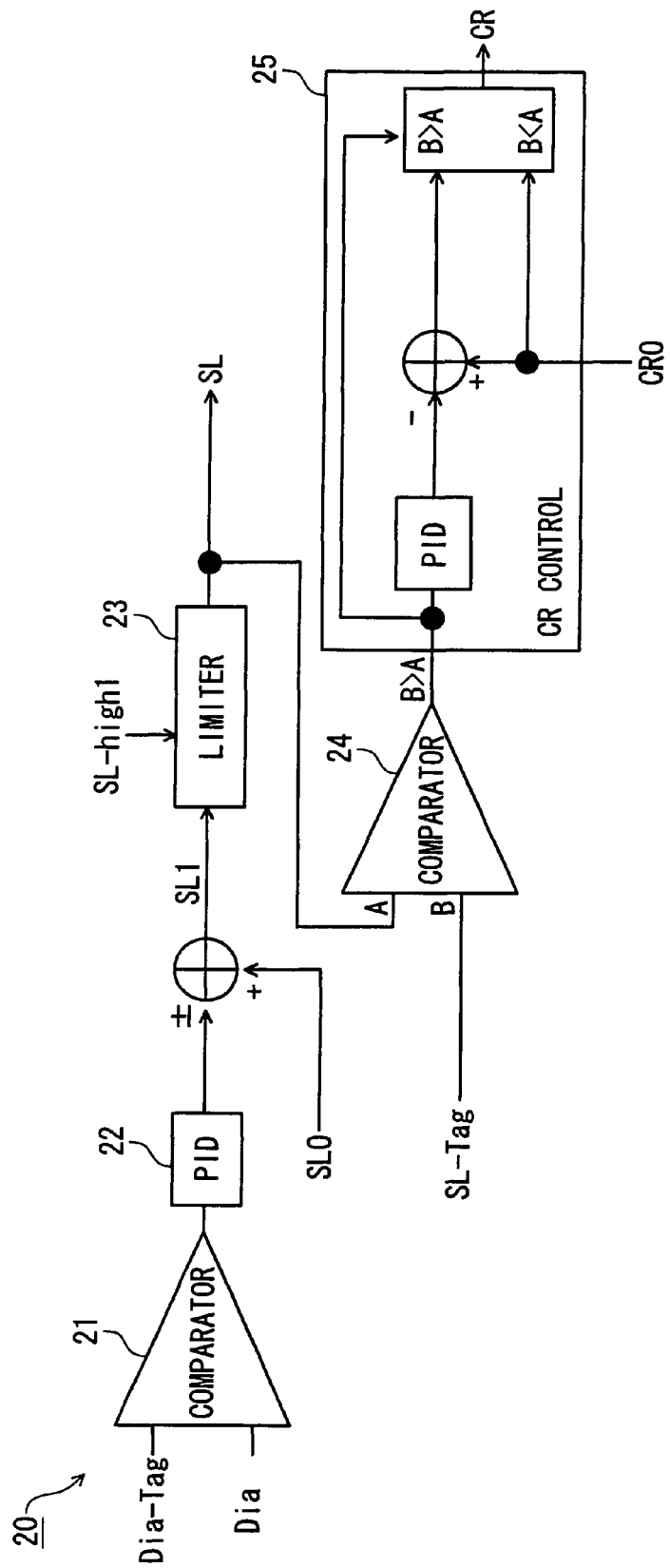
FIG. 2 is a block diagram showing a configuration of a first embodiment of a neck portion forming control circuit provided to the single crystal pulling-up apparatus in FIG. 1.

FIG. 2 shows a configuration of a neck portion forming control circuit 20 provided to the arithmetic controller 8b.

The neck portion forming control circuit 20 shown in FIG. 2 includes a comparator 21. The comparator 21 is input with a target value of a neck diameter (Dia-Tag) stored previously as arrangement data, for example, in the storage device 8a, and a measured value of the neck diameter (Dia) detected by the image processor 17, and functions to output the difference between the Dia-Tag and the Dia.

Further, the control circuit 20 includes a PID control circuit 22 (a first compensation portion) that performs proportional control (P control: compensation based on the current deviation), integrative control (I control: compensation based on the amount of error in the past), and differential control (D control: compensation by predicting based on the gradient of the difference), and outputs a compensated value (difference) of the pulling-up speed. The compensated value output from the PID control circuit 22 is added to the pulling-up speed current value SL0 and output as a compensated first pulling-up speed SL1.

Further, the neck portion forming control circuit 20 includes a limiter circuit 23 (a second compensation portion) that limits the first pulling-up speed SL1 to an upper limit value (first limit value SL-high1) and outputs a finally compensated second pulling-up speed SL. The output from the limiter circuit 23 is used as a pulling-up speed for the seed crystals P.

Further, the neck portion forming control circuit 20 includes a comparator 24 and a CR control circuit 25 as a crucible rotation number compensation portion.

The comparator 24 is input with an output from the limiter circuit 23 (second pulling-up speed SL) and a target value of the pulling-up speed (SL-Tag), for example, stored previously as the arrangement data in the storage device 8a and, when the target value SL-Tag is larger than the pulling-up speed SL, the difference between the SL-Tag and the SL is output.

In a case where the target value SL-Tag is larger than the pulling-up speed SL, the CR control circuit 25 controls so as to decrease the number of rotation of the crucible. Specifically, when a difference is imputed from the comparator 24, the control circuit 25 performs PID control (proportional control, differential control, and integrative control), outputs the compensation value (difference) for the number of rotation of the crucible based on the difference value, and outputs the compensation value by subtracting the compensation value from the standard value of the number of rotation of the crucible (CR0). The output value from the CR control circuit 25 is used as a crucible rotation number CR controlled by the motor control section 10a.

In the single crystal pulling-up apparatus 1 constituted as described above, single crystals are grown as described below by executing the single crystal growing program and by operating the neck portion forming control circuit 20.

At first, a gas flow of an Ar gas is formed from the gas introduction port 18 to the gas exhaust ports 19, that is, from the upper portion to the lower portion in the furnace body 2 to form a predetermined atmosphere.

The step of forming the neck portion P1 by the control of the neck portion forming control circuit 20 having the configuration as described above is performed along the flow shown in FIG. 3.

Figure 3:
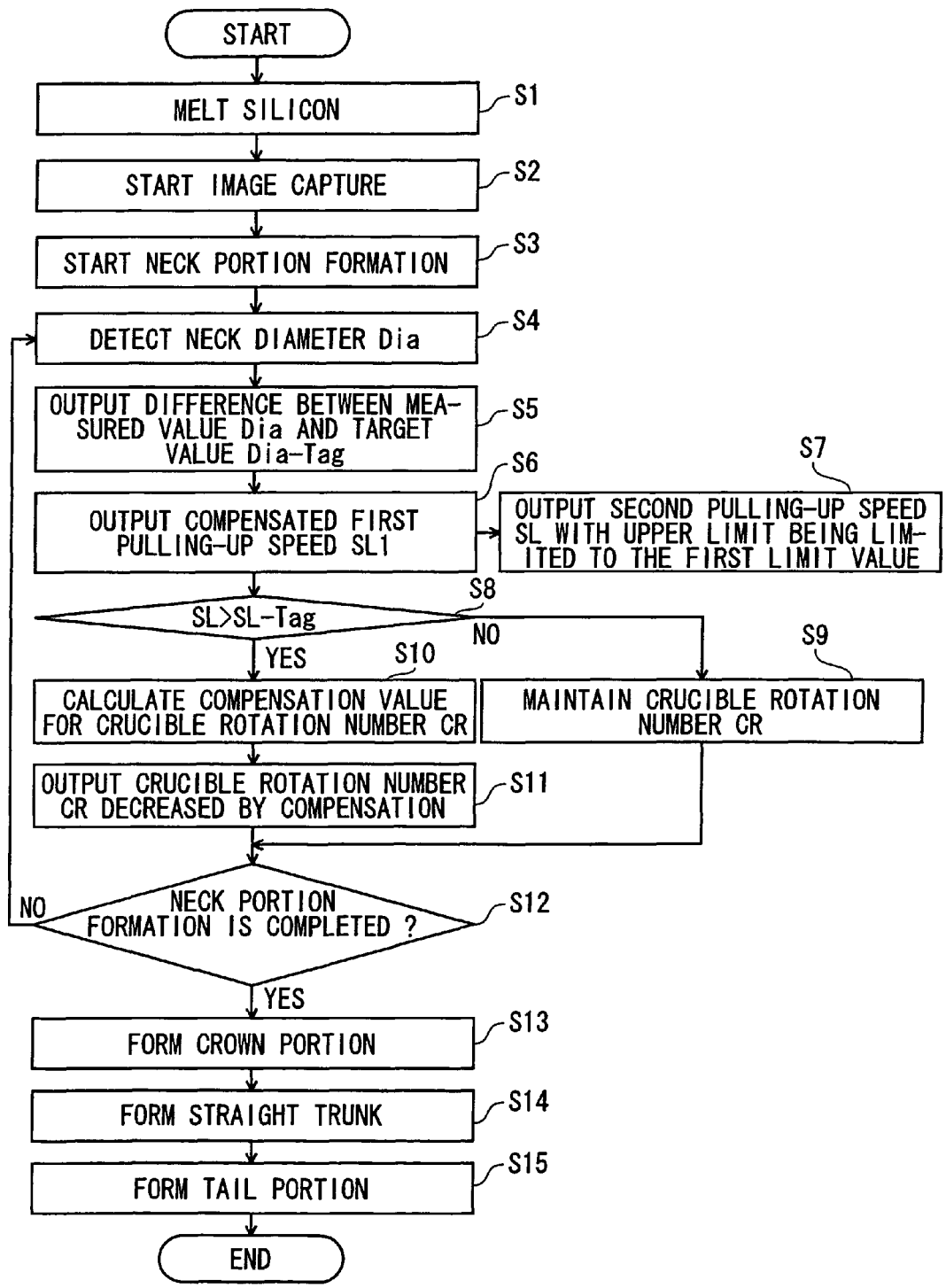
FIG. 3 is a flow chart showing a flow of a single crystal pulling-up step by a single crystal pulling-up apparatus provided with the neck portion forming control circuit in FIG. 2.

First, the heater control section 9 is operated by the instruction from the arithmetic controller 8b to heat the heater 4, and the polysilicon M is melted in the crucible 3 (step S1 in FIG. 3).

Further, the motor control section 10a and the lifting device control section 11a are operated by the instruction from the arithmetic controller 8b, and the crucible 3 is rotationally operated by a predetermined number of rotation (standard value CR0) at a predetermined position of the height.

Further, the neck diameter detector 14 is operated by the instruction from the arithmetic controller 8b, and the CCD camera 16 starts image capture for a predetermined spot on the surface of the molten liquid, specifically, for the crystal pulling-up spot (step S2 in FIG. 3). Then, image signals captured by the CCD camera 16 are supplied to the image processor 17.

Then, the wire reel rotation device control section 12 is operated by the instruction from the arithmetic controller 8b, and the winding mechanism 5a is operated to descend the wire 5b. Then, the seed crystals P attached to the wire 5b are brought into contact with the molten silicon liquid M, and necking of melting the top end of the seed crystals P is conducted thereby starting the formation of the neck portion P1 (step S3 in FIG. 3).

Upon formation of the neck portion P1, the diametrical size Dia (measured value) of the neck portion P1 detected by the neck diameter detector 14 is input to the neck portion forming control circuit 20 and, based on the input, the pulling-up control is performed.

Specifically, when the image of the neck portion P1 during growing is captured by the CCD camera 16, the neck diameter is detected in the image processor 17, and the measured value Dia is supplied to the neck portion forming control section 20 of the arithmetic controller 8b (step S4 in FIG. 3).

Figure 4A:
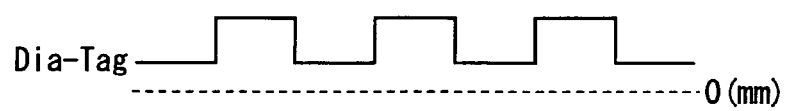
FIGS. 4A to 4F are timing charts for each of signals used in the neck portion forming control circuit in FIG. 2.
Figure 4B:

In the neck portion forming control circuit 20, the target value Dia-Tag of the neck portion diameter (refer to FIG. 4A) and the measured value Dia (refer to FIG. 4B) are compared and the difference between them is output to the PID control circuit 22 (step S5 in FIG. 3).

Figure 4C:
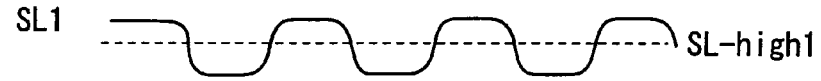

The PID control circuit 22 performs the PID control (proportional control, differential control, and integrative control) based on the input difference value and outputs a compensation value for the pulling-up speed which is necessary for adjusting the neck portion diameter identical with the target value Dia-Tag. The output compensation value is added to the pulling-up speed current value SL0 and the compensation first pulling-up speed SL1 (refer to FIG. 4C) is output (step S6 in FIG. 3).

Figure 4D:
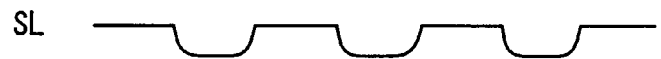
Figure 13A:
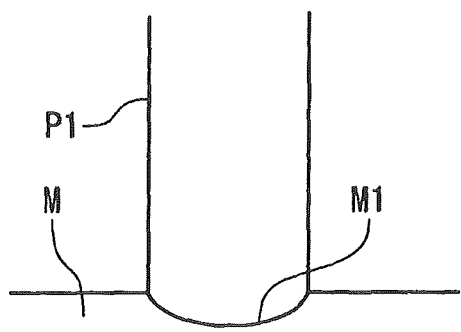
FIGS. 13A and 13B are partial enlarged front views of seed crystals for explaining the state of a boundary between seed crystals and a molten silicon liquid.
Figure 13B:
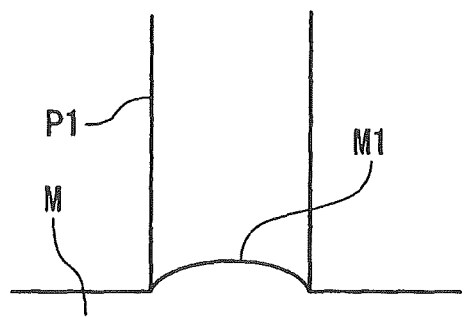

Then, in a case of controlling the pulling-up of the seed crystals P based on the compensated first pulling-up speed SL1, when the pulling-up speed is at a predetermined speed or higher (for example, 2.5 mm/min or more), the boundary M1 may possibly take a concave shape as shown in FIG. 13B to result in dislocation. Accordingly, the upper limit of the pulling-up speed SL1 is limited to the first limit value SL-high1 by the limiter circuit 23, and the pulling-up speed SL1 is output, while being converted to a second pulling-up speed SL (refer to FIG. 4D) such that the boundary M1 does not take a convex shape (step S7 in FIG. 3).

Meanwhile, in a case of using the pulling-up speed SL output as described above and controlling the number of rotation of the crucible to a constant level, since the upper limit value of the pulling-up speed SL1 is limited to the pulling-up speed SL, the neck diameter may possibly be different greatly from the target value Dia-Tag while the pulling-up speed SL is at the upper limit value.

Figure 4E:

In view of the above, in the neck portion forming control circuit 20, the pulling-up speed SL1 and the target value SL-Tag of the pulling-up speed (refer to FIG. 4E) are compared and, when the target value SL-Tag is greater than the pulling-up speed SL, the difference between the SL-Tag and the SL is output to the CR control circuit 25 (step S8 in FIG. 3).

When the difference value of the pulling-up speed is input to the CR control circuit 25 (Yes at step S8), by performing the PID control (proportional control, differential control, and integrative control), a compensation value for the crucible rotation number CR which is required so as to adjust the neck portion diameter identical with the target value Dia-Tag is output (step S10 in FIG. 3). The compensation value has a magnitude in proportion to the difference value.

Figure 4F:
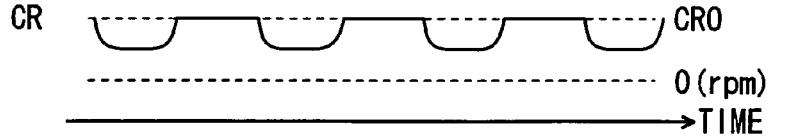

Then, the obtained compensation value for the crucible rotation number CR is subtracted from the standard value CR0 for the number of rotation of the crucible and the crucible rotation number CR decreased by compensation (refer to FIG. 4F) is output (step S11 in FIG. 3).

As described above, in a case where the target value SL-Tag of the pulling-up speed is larger than the pulling-up speed SL, that is, during a period where the upper limit value of the pulling-up speed SL is limited to the first limit value SL-high1, the crucible rotation number CR is controlled so as to be decreased, and the insufficiency of the pulling-up speed of the seed crystals P during formation of the reduced diameter portion is compensated.

On the other hand, at step S8 in FIG. 3, when the target value SL-Tag is smaller than the pulling-up speed SL (No at step S8), the standard value CR0 of the crucible rotation number is maintained (step S9 in FIG. 3).

As described above, in the step for forming the neck portion P1, pulling-up of the seed crystals P1 is controlled based on the pulling-up speed SL and the crucible rotation number CR output from the neck portion forming control circuit 20, and the enlarged diameter portion and the reduced diameter portion are formed alternately until the neck portion reaches a predetermined length (step S12 in FIG. 3).

Further, when the neck portion P1 is grown to the predetermined length, the pulling-up conditions are further adjusted based on the power supplied to the heater 4, the pulling-up speed (usually at a speed of several millimeters per minute), etc. as the parameters by the instruction from the arithmetic controller 8b, and single crystals C as a portion of a product is grown.

That is, a step for forming a crown portion (step S13 in FIG. 3), a step for forming a straight trunk (step S14 in FIG. 3) and a step for forming a tail portion (step S15 in FIG. 3) are performed successively, and the grown single crystals C are finally pulled-up to the upper portion in the furnace body 2.

As described above according to the first embodiment of the invention, in the step of forming the neck portion P1, the enlarged diameter portion and the reduced diameter portion are formed alternately by controlling the pulling-up speed of the seed crystals P. In the formation of the reduced diameter portion, it is controlled that the upper limit value of the pulling-up speed SL is limited and the rotational speed of the crucible (crucible rotation number CR) is lowered.

This can avoid the risk of dislocation caused by the pulling-up speed of the seed crystals P and the diameter of the neck portion P1 comprising the enlarged diameter portion and the reduced diameter portion is conformed with the target value, and single crystal of stable quality can be grown.

Successively, a second embodiment of the single crystal pulling-up apparatus and the single crystal pulling-up method according to the invention is described below.

In the second embodiment, the configuration of the neck portion forming control circuit 20 is different from the configuration shown in the first embodiment, specifically, the circuit configuration for outputting the crucible rotation number CR is different from that of the first embodiment.

Figure 5:
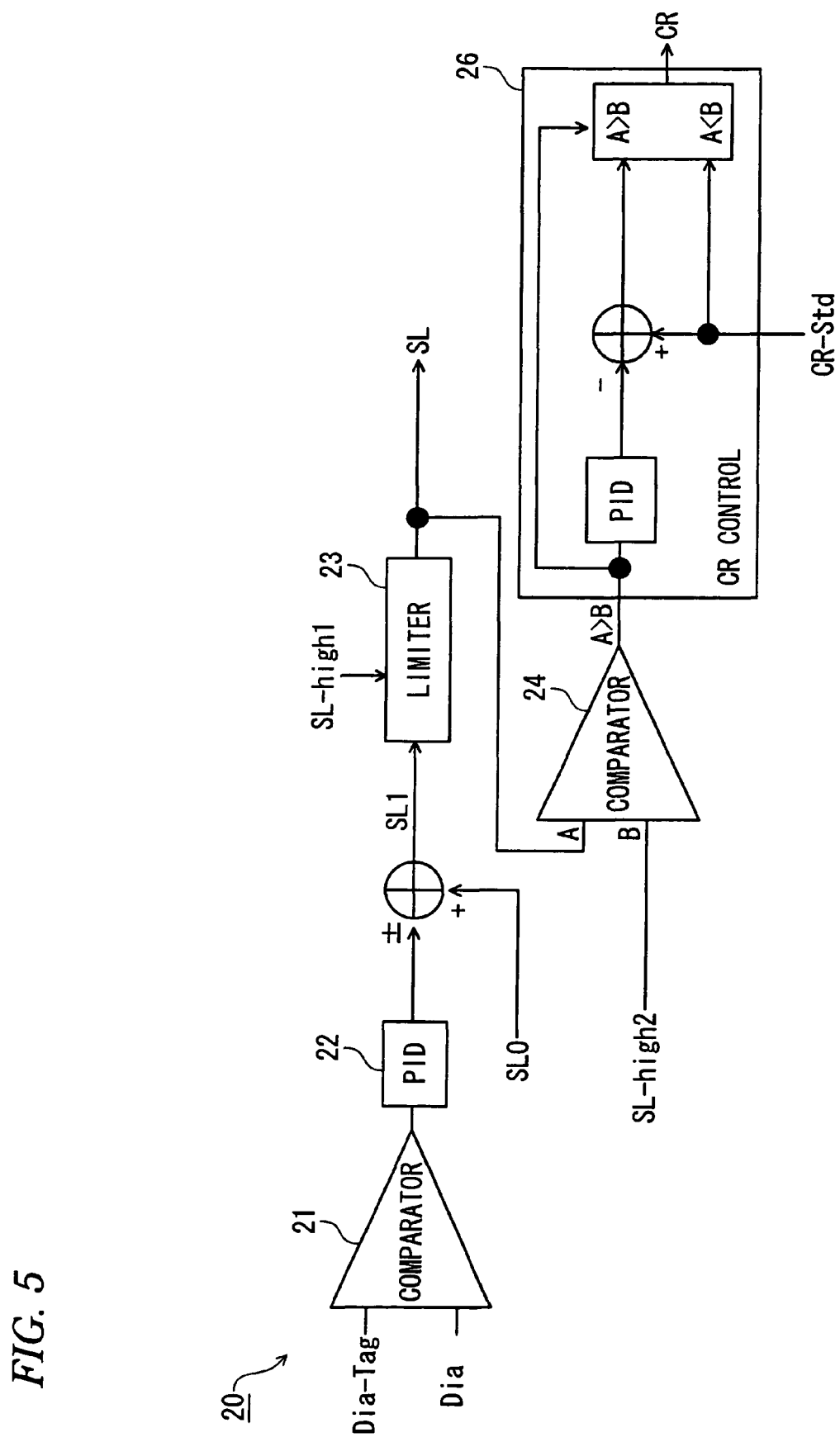
FIG. 5 is a block diagram showing a configuration of a second embodiment of the neck portion forming control circuit provided in the single crystal pulling-up apparatus in FIG. 1.

FIG. 5 shows the configuration of a neck portion forming control circuit in the second embodiment. In FIG. 5, elements which are identical or may be regarded as identical with the configuration in the first embodiment described previously with reference to FIG. 2 carry the same references.

In a neck portion forming control circuit 20 in FIG. 5, a compensated first pulling-up speed SL1 and a second limit value SL-high2 of the pulling-up speed are input to a comparator 24 and, in a case where the pulling-up speed SL1 is larger than the second limit value SL-high2, the difference between the SL-high2 and the SL1 is output. The second limit value SL-high2 is a predetermined value which is set lower than the first limit value SL-high1 described above.

Further, the difference value output from the comparator 24 is input to a CR control circuit 26. The CR control circuit 26 controls the crucible rotation number CR based on the input difference value. In the second embodiment, the comparator 24 and the CR control circuit 26 constitute the crucible rotation number compensation portion.

The step of forming the neck portion P1 by the control of the neck portion forming control circuit 20 having the configuration as described above is performed along the flow shown in FIG. 6.

Figure 6:
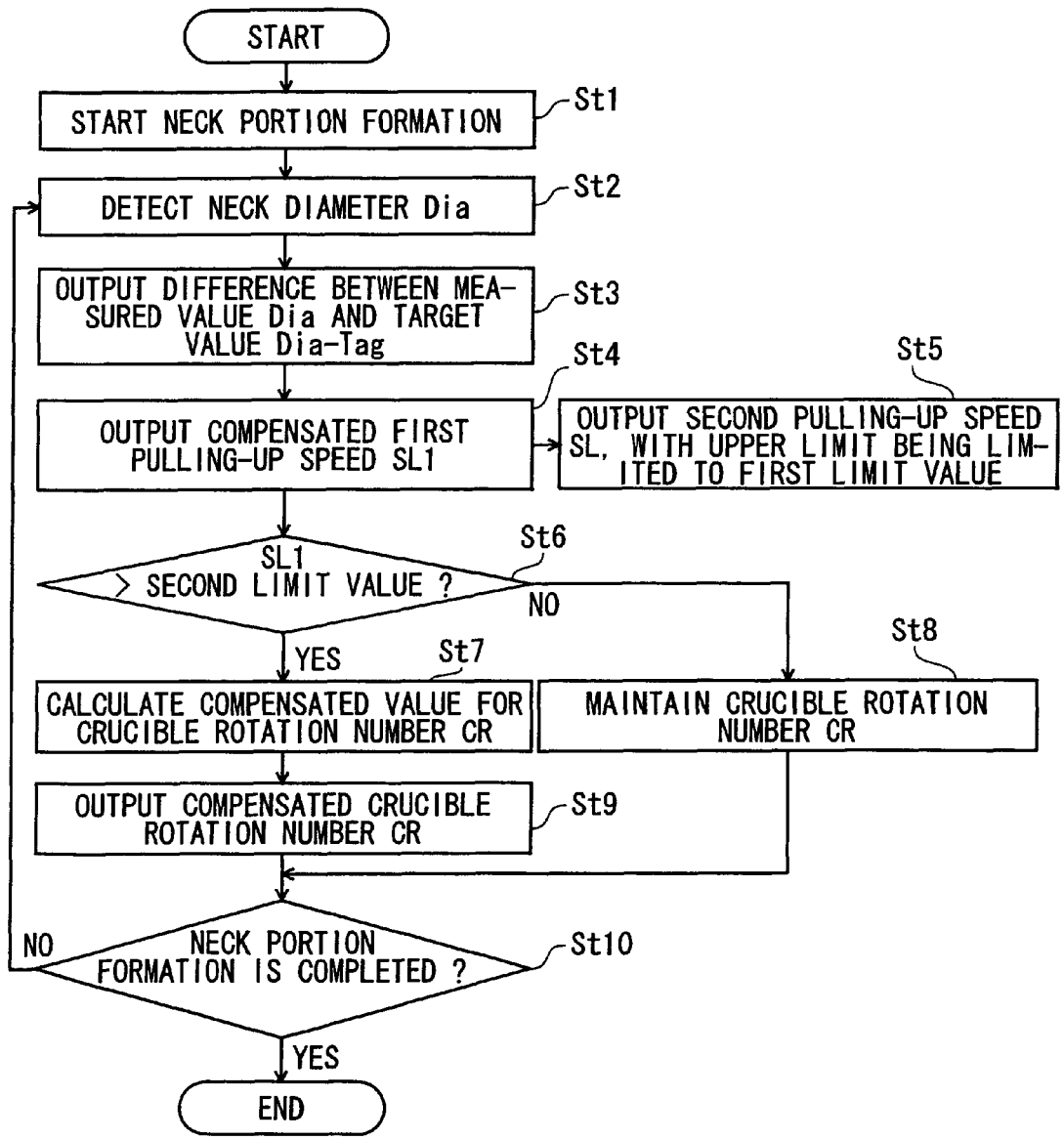
FIG. 6 is a flow chart showing a flow of a neck portion forming step by the single crystal pulling-up apparatus provided with the neck portion forming control circuit in FIG. 5.

That is, when the step of forming the neck portion P1 is started (step St1 in FIG. 6), the image processor 17 performs a geometry recognition with respect to the image for the neck portion P1 during growing captured by the CCD camera 16, and the measured value Dia of the neck portion diameter is sent as a result of detection to the arithmetic controller 8b (step St2 in FIG. 6).

Figure 7A:
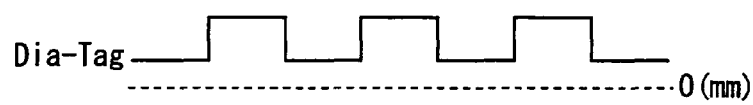
FIGS. 7A to 7F are timing charts for each of signals used in the neck portion forming control circuit in FIG. 5.
Figure 7B:
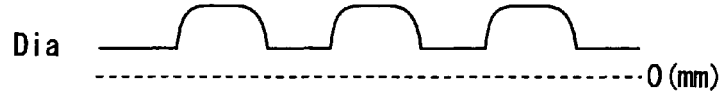

In the arithmetic controller 8b, the comparator 21 of the neck portion forming control circuit 20 compares the target value Dia-Tag (refer to FIG. 7A) and a measured value Dia (refer to FIG. 7B) of the neck portion diameter, and outputs the difference between the Dia-Tag and the Dia to a PID control circuit 22 (step St3 in FIG. 6).

Figure 7C:
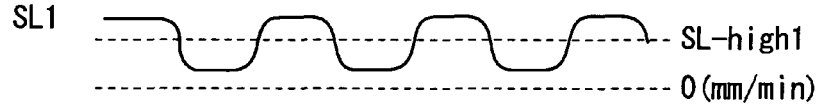

By the PID control (proportional control, differential control, and integrative control), the PID control circuit 22 outputs a compensation value for the pulling-up speed that is necessary for adjusting the neck portion diameter to be identical with the target value Dia-Tag. The output compensation value is added to the pulling-up speed current value SL0, and the compensated first pulling-up speed SL1 (refer to FIG. 7C) is output (step St4 in FIG. 6).

Figure 7D:
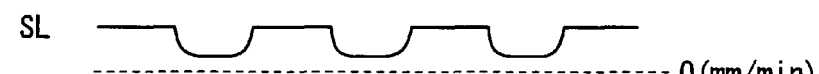

Since the pulling-up speed is sometimes excessively high when the pulling-up of the seed crystal P is controlled while using the value of the pulling-up speed SL1 as it is, the upper limit of the pulling-up speed SL1 is limited to a first limit value SL-high1 by the limiter circuit 23 and the pulling-up speed SL1 is output as a speed SL (refer to FIG. 7D) in such a range that the boundary M1 has no convex shape (Step St5 in FIG. 6).

Further, the pulling-up speed SL1 and a second limit value SL-high 2 are compared in a comparator 24, and the result of comparison is input to a CR control circuit 26 (step St6 in FIG. 6).

Figure 7E:
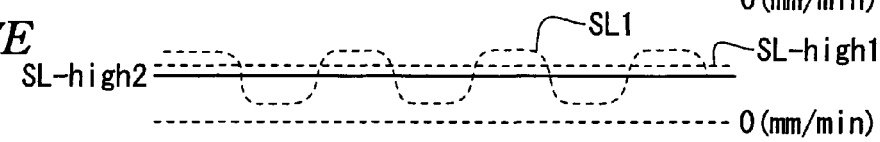

When the pulling-up speed SL1 is more than the second limit value SL-high 2 (refer to FIG. 7E) (Yes at step St6), the CR control circuit 26 outputs a compensation value in proportion to the magnitude of the difference by PID control (step St7 in FIG. 6) and lowers the crucible rotation number CR by subtracting the compensation value from the current value CR0 for the number of rotation of the crucible (step St9 in FIG. 6).

On the other hand, when the pulling-up speed SL1 is less than the second limit value Sl-high2 (refer to FIG. 7E) (No at step St6), the CR control circuit 26 conducts control of maintaining the crucible rotation number CR to a standard value (step St8 in FIG. 6).

Figure 7F:
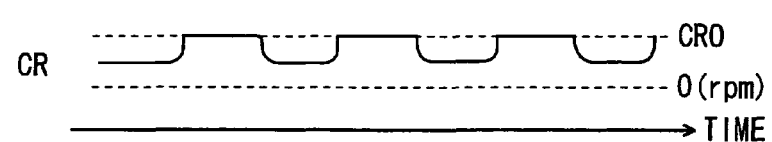

That is, as shown in FIG. 7F, when the pulling-up speed SL1 is more than the second limit value SL-high2, it is controlled such that the crucible rotation number CR is lowered, thereby compensating the insufficiency of the pulling-up speed SL of the seed crystals (step St9 in FIG. 6).

Further, control for the pulling-up speed SL and the crucible rotation number CR is conducted until the neck portion P1 reaches a predetermined length (step St10 in FIG. 6).

As described above, in the second embodiment according to the invention, when the compensated first pulling-up speed SL1 exceeds the second limit value SL-high2 which is set to a value less than the first limit value SL-high1, control for lowering the crucible rotation number CR is started.

That is, since the control of lowering the crucible rotation number CR is started before the first pulling-up speed SL reaches the first limit value SL-high1, the number of rotation in the actual rotational operation of the crucible can be switched with no delay (rapidly) upon changing the setting for the number of rotation of the crucible.

Successively, a third embodiment of the single crystal pulling-up apparatus and the single crystal pulling-up method according to the invention is described below.

Figure 8:
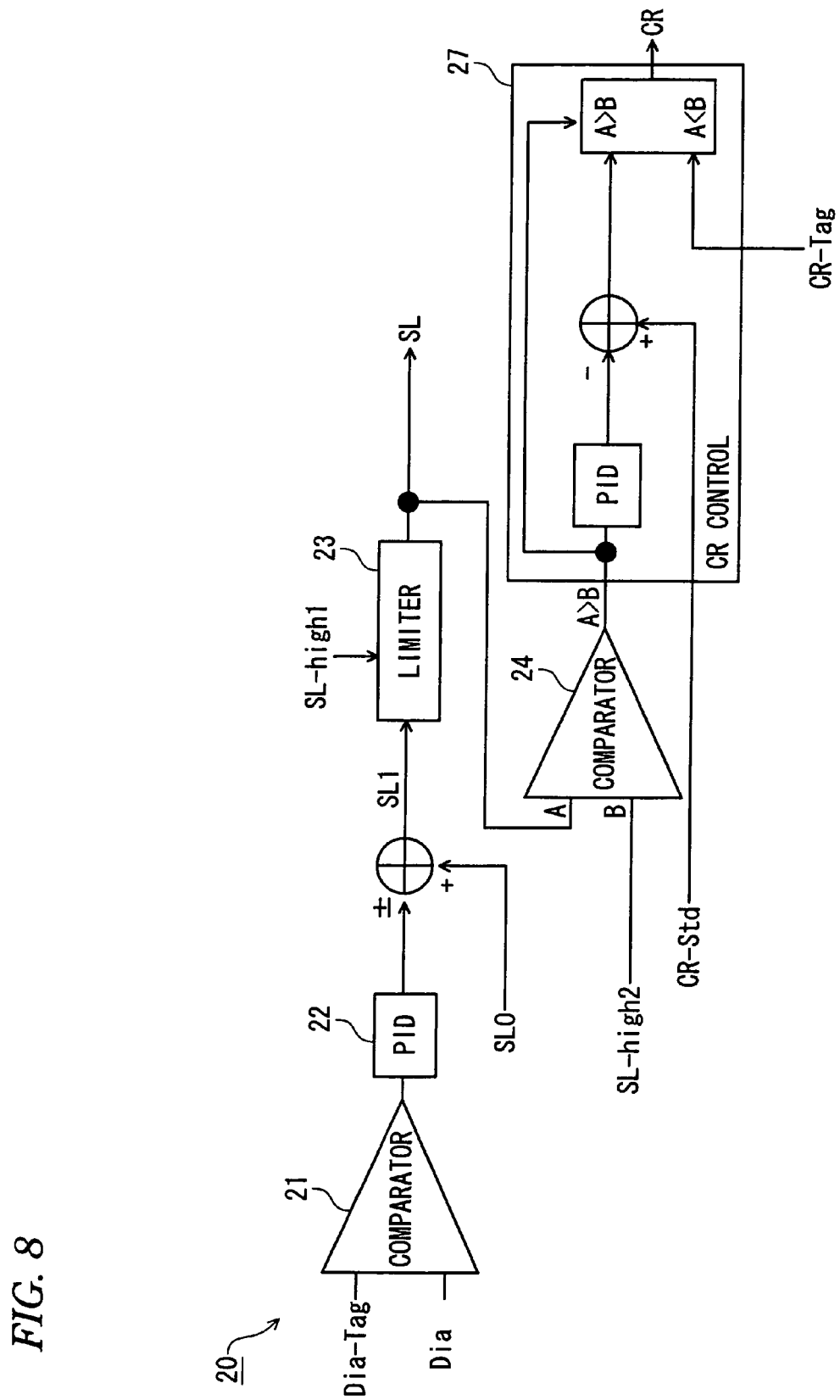
FIG. 8 is a block diagram showing a configuration of a third embodiment of the neck portion forming control circuit provided in the single crystal pulling-up apparatus in FIG. 1.
Figure 9A:
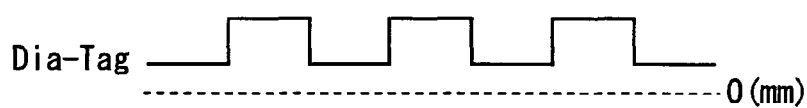
FIGS. 9A to 9G are timing charts for each of signals used in the neck portion forming control circuit in FIG. 8.
Figure 9B:
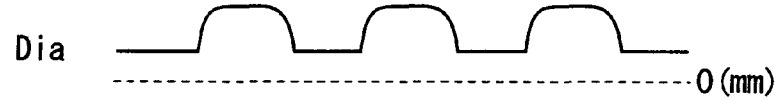
Figure 9C:
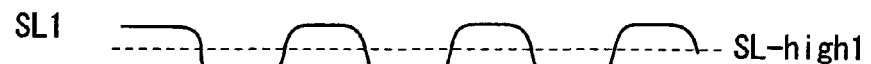
Figure 9D:
Figure 9E:
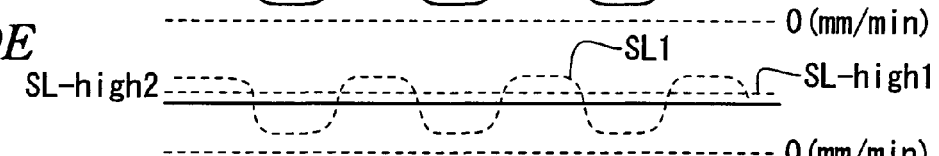
Figure 9F:
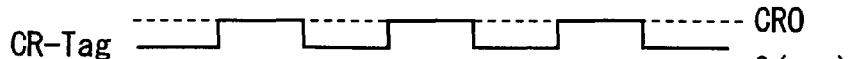
Figure 9G:
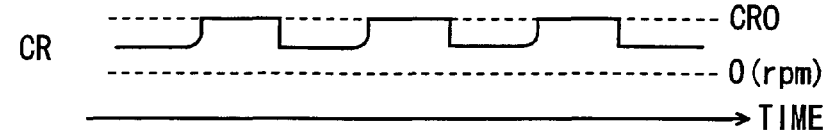
Figure 11:
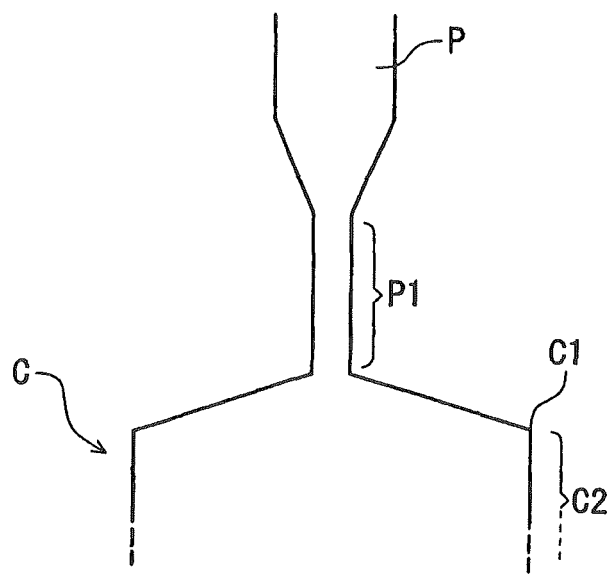
FIG. 11 is a partial enlarged front view of FIG. 10 for explaining each of the portions of single crystals to be grown.
Figure 12:
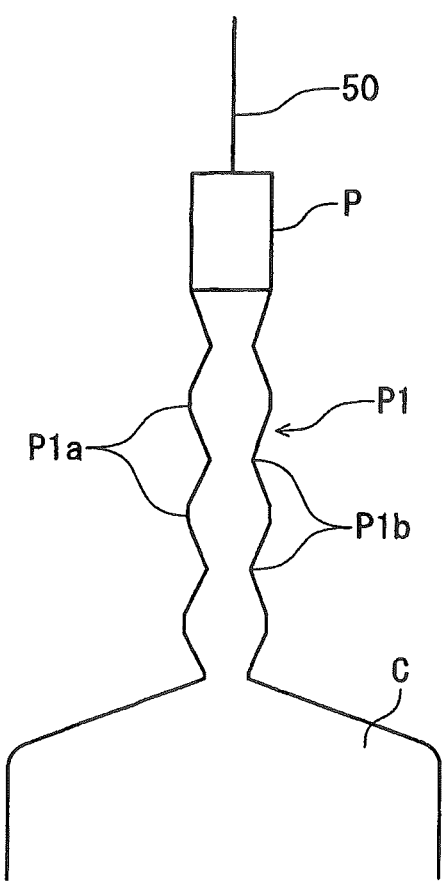
FIG. 12 is a partial enlarged front view of single crystals showing the state of forming an enlarged diameter portion and a reduced diameter portion alternately in the neck portion.

In the third embodiment, as shown in FIG. 8, a CR control circuit 27 is disposed instead of the CR control circuit 26 in the configuration of the neck portion forming control circuit 20 in the second embodiment described above. A target value CR-Tag for the number of rotation of crucible previously stored as an arrangement data, for example, in the storage device 8a (refer to FIG. 9F) is further input.

In the neck portion forming control circuit 20 constituted as described above, when the pulling-up speed SL1 is less than the second limit value SL-high2 in the CR control circuit 27 (refer to FIG. 9E), the target value CR-Tag for the number of rotation of the crucible (refer to FIG. 9F) is output as a crucible rotation number CR (corresponding to the operation at step St8 in FIG. 6).

By performing such control, the value for the crucible rotation number CR can be changed rapidly not only in a case where the pulling-up speed SL0 exceeds the second limit value SL-high2 but also in a case where it changes to a state that the pulling-up speed SL0 falls below the second limit value SL-high2.

While exemplary embodiments have been described, the exemplary embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A single crystal pulling-up apparatus of pulling-up silicon single crystals by a Czochralski method by bringing seed crystals into contact with a molten silicon liquid in a crucible and by growing a neck portion where an enlarged diameter portion and a reduced diameter portion are formed alternately, the apparatus comprising:
   a neck diameter measuring portion which measures a diameter of a grown neck portion;
   a first compensation portion which outputs a first compensated pulling-up speed for the seed crystals based on a difference between a measured value of the diameter of the neck portion obtained from the neck diameter measuring portion and a target value of the neck portion diameter previously stored in a storage portion;
   a second compensation portion which outputs a second pulling-up speed while limiting an upper limit of the first pulling-up speed to a first limit value; and
   a crucible rotation number compensation portion which lowers a number of a rotation of the crucible at least in a period where the upper limit of the first pulling-up speed is limited to the first limit value.

2. The single crystal pulling-up apparatus according to claim 1, wherein the crucible rotation number compensation portion detects a period where the upper limit of the first pulling-up speed is limited to the first limit value based on a difference between a previously stored target value for the pulling-up speed of the seed crystals and the second pulling-up speed, and controls the number of rotation of the crucible so as to be lowered in proportion to a magnitude of the difference in the period.

3. The single crystal pulling-up apparatus according to claim 1, wherein the crucible rotation number compensation portion compares the first pulling-up speed and a second limit value which is set to a value less than the first limit value, and
   wherein, when the first pulling-up speed is more than the second limit value, the crucible rotation number compensation portion controls the number of rotation of the crucible so as to be lowered in proportion to a magnitude of a difference between the first pulling-up speed and the second limit value.

4. The single crystal pulling-up apparatus according to claim 1, wherein the crucible rotation number compensation portion compares the first pulling-up speed and the second limit value which is set to a value less than the first limit value,
   wherein, when the first pulling-up speed is less than the second limit value, the crucible rotation number compensation portion outputs a target value for the number of rotation of the crucible previously stored in the storage, and
   wherein, when the first pulling-speed is more than the second limit value, the crucible rotation number compensation portion controls the number of rotation of the crucible so as to be lowered in proportion to a magnitude of a difference between the first pulling-up speed and the second limit value.

5. A single crystal pulling-up method of pulling-up silicon single crystals by a Czochralski method by bringing seed crystals into contact with a molten silicon liquid in a crucible and by growing a neck portion where an enlarged diameter portion and a reduced diameter portion are formed alternately, the method comprising:
   measuring a diameter of a grown neck portion;
   a first outputting of a compensated first pulling-up speed of the seed crystals based on a difference between a measured value of the diameter of the neck portion and a target value of the neck portion previously stored in a storage portion;
   a second outputting of a second pulling-up speed in which an upper limit of the first pulling-up speed is limited to a first limit value; and
   lowering a number of a rotation of the crucible at least for a period where the upper limit of the first pulling-up speed is limited to the first limit value.

6. The single crystal pulling-up method according to claim 5, wherein the lowering includes:
   detecting a period where the upper limit of the first pulling-up speed is limited to the first limit value based on a difference between the previously stored target value of the pulling-up speed for the seed crystals and the second pulling-up speed; and controlling the number of the rotation of the crucible so as to be lowered in proportion to a magnitude of the difference in the period.

7. The single crystal pulling-up method according to claim 5, wherein the lowering includes:

comparing the first pulling-up speed and a second limit value which is set to a value less than the first limit value; and when the first pulling-up speed is more than the second limit value, controlling the number of the rotation of the crucible so as to be lowered in proportion to a magnitude of a difference between the first pulling-up speed and the second limit value.

8. The single crystal pulling-up method according to claim 5, wherein the lowering includes:

comparing the first pulling-up speed and a second limit value which is set to a value smaller than the first limit value;

when the first pulling-up speed is less than the second limit value, outputting a target value for the number of the rotation of the crucible previously stored in the storage portion; and when the first pulling-up speed is more than the second limit value, controlling the number of the rotation of the crucible so as to be lowered in proportion to a magnitude of a difference between the first pulling-up speed and the second limit value.

9. The single crystal pulling-up apparatus according to claim 1, further comprising:

a control circuit comprising:

the first compensation portion;

the second compensation portion, the second compensation portion being configured to receive the first pulling-up speed outputted from the first compensation portion to control a pulling-up speed of the seed crystals; and the crucible rotation number compensation portion, the crucible rotation number compensation portion being configured to receive the second pulling-up speed outputted from the second compensation portion and to control of the number of the rotation of the crucible and a pulling-up speed.

10. The single crystal pulling-up apparatus according to claim 9, wherein the control circuit further comprises:

a comparator that is input with the target value and the measured value of the neck diameter, the comparator being configured to output to the first compensation portion the difference between the target value and the measured value of the neck diameter.

11. The single crystal pulling-up apparatus according to claim 10, wherein the first compensation portion is configured to perform a proportional control, an integrative control, and a differential control, and to output a compensated value that includes the difference between the target value and the measured value of the neck diameter.

12. The single crystal pulling-up apparatus according to claim 11, wherein the proportional control includes a compensation based on a current deviation, wherein the integrative control includes a compensation based on an amount of an error, and wherein the differential control includes a compensation based on a gradient of the difference between the target value and the measured value of the neck diameter.

13. The single crystal pulling-up apparatus according to claim 11, further comprising:

a summing circuit configured to add the compensated value outputted from the first compensation portion to a pulling-up speed current value, and to output the first compensated pulling-up speed to the second compensation portion.

14. The single crystal pulling-up apparatus according to claim 13, wherein the second compensation portion is configured to limit the first pulling-up speed to the upper limit and to output the second pulling-up speed as the pulling-up speed of the seed crystals.

15. The single crystal pulling-up apparatus according to claim 14, wherein the control circuit further comprises:

another comparator configured to receive an output of the second compensation portion and a target value of the pulling-up speed of the seed crystals, said another comparator being configured to output to the crucible rotation number compensation portion a difference between the target value of the pulling-up speed of the seed crystals and the second pulling-up speed.

16. The single crystal pulling-up apparatus according to claim 15, wherein, when the target value of the pulling-up speed of the seed crystals is more than the second pulling-up speed, the crucible rotation number compensation portion is configured to lower the number of the rotation of the crucible.

17. The single crystal pulling-up apparatus according to claim 16, wherein, after receiving from said another comparator, the difference between the target value of the pulling-up speed of the seed crystals and the second pulling-up speed, the crucible rotation number compensation portion is configured to perform the proportional control, the differential control, and the integrative control.

18. The single crystal pulling-up apparatus according to claim 17, wherein the crucible rotation number compensation portion is configured to output a compensation value for the number of rotation of the crucible based on the difference between the target value of the pulling-up speed of the seed crystals and the second pulling-up speed by subtracting the compensation value for the number of rotation of the crucible from a standard value of the number of the rotation of the crucible.

19. The single crystal pulling-up apparatus according to claim 18, wherein the compensation value output from the crucible rotation number compensation portion is used as the number of the rotation of crucible.

20. The single crystal pulling-up apparatus according to claim 19, wherein the comparator, the first compensation portion, the second compensation portion, the second compactor, and the second compensation portion are arranged in the control circuit sequentially in series.

* * * * *